United States Patent [19]

Spears

[11] Patent Number: 5,740,525

[45] Date of Patent: Apr. 14, 1998

[54] METHOD AND APPARATUS FOR TEMPERATURE COMPENSATION OF A REFERENCE OSCILLATOR IN A COMMUNICATION DEVICE

[75] Inventor: John H. Spears, McHenry, Ill.

[73] Assignee: Motorola, Inc., Schaumburg, Ill.

[21] Appl. No.: 644,320

[22] Filed: May 10, 1996

[51] Int. Cl.$^6$ .................................................... H04B 1/26
[52] U.S. Cl. ...................... 455/259; 455/264; 455/196.1
[58] Field of Search ............................. 455/182.1, 192.1, 455/196.1, 147.1, 259, 264, 310; 331/176, 177 R

[56] References Cited

U.S. PATENT DOCUMENTS

| | | | |
|---|---|---|---|
| 4,254,382 | 3/1981 | Keller et al. | 331/116 |
| 4,921,467 | 5/1990 | Lax | 455/264 |
| 5,081,431 | 1/1992 | Kubo et al. | 33/158 |
| 5,113,416 | 5/1992 | Lindell | 375/97 |
| 5,151,703 | 9/1992 | Roos | 342/199 |
| 5,170,492 | 12/1992 | Moller et al. | 455/76 |
| 5,357,221 | 10/1994 | Matero | 332/123 |
| 5,473,284 | 12/1995 | Jäntti et al. | 331/10 |

FOREIGN PATENT DOCUMENTS

WO 94/27372  11/1994  WIPO .
WO 95/34133  12/1995  WIPO .

*Primary Examiner*—Reinhard J. Eisenzopf
*Assistant Examiner*—Thanh Le
*Attorney, Agent, or Firm*—John G. Rauch

[57] ABSTRACT

A reference oscillator (118) in a communication device (100) such as a radiotelephone is controlled by temperature compensating the reference oscillator (118). At the time of manufacture, characterizing data are stored in non-volatile memory (128) in the communication device (100). When the communication device (100) is powered up, the characterizing data are read and used to provide an initial correction (206) to the output frequency of the reference oscillator (118). Subsequently, an automatic frequency control operation is performed using the RF signal received from a remote transmitter as a reference signal. A frequency correction is determined (214) in the form of a frequency step size and step direction. The output frequency of the reference oscillator is repeatedly stepped until frequency error is minimized.

12 Claims, 2 Drawing Sheets

METHOD AND APPARATUS FOR TEMPERATURE COMPENSATION OF A REFERENCE OSCILLATOR IN A COMMUNICATION DEVICE

FIELD OF THE INVENTION

The present invention relates generally to communication devices. The present invention relates more particularly to temperature compensation of a reference oscillator in a communication device.

BACKGROUND OF THE INVENTION

Communication devices such as radiotelephones generally include a radio receiver and/or a radio transmitter. For controlling the frequency of reception or transmission, the radio further includes a local oscillator or reference oscillator. The reference oscillator provides an oscillating signal at a known frequency. Commonly, a crystal is employed as the source of the oscillating signal. The receiver and transmitter are tuned to appropriate frequencies using this oscillating signal as a reference.

For reliable performance, the signal produced by the reference oscillator must maintain its frequency without drift. Two sources of drift in output frequency are variation in operating temperature of the reference oscillator and aging of the crystal over the operating life of the communication device. Compensation is used to produce an oscillating signal largely immune to variations in temperature and due to aging.

One known method of compensation in a communication device is automatic frequency control using the frequency of a received signal as a stable frequency reference. For example, a mobile station in a communication system may adjust its reference oscillator by comparing the frequency of the oscillating signal produced by the reference oscillator to the frequency of signals received from a base station. In response to a binary error signal produced in response to the comparison, the mobile station adjusts the reference oscillator frequency, reducing the frequency if the error signal is "HI" and increasing the frequency if the error signal is "LO." By periodically repeating the comparison, the reference oscillator frequency is maintained within acceptable limits.

The effectiveness of this method is limited by uncertainty as to the magnitude and sign of the frequency error upon startup. The automatic frequency control may have to spend substantial time hunting for the proper correction, creating a time delay in initiating a radio link. This delay may be inconvenient or unacceptable to the user.

Another known method of compensation in a communication device involves characterizing the frequency variation of the reference oscillator with temperature at the time of manufacture. Data relating the frequency variation with temperature are stored in a memory for recall. Subsequently, during operation of the radio, temperature measurements are repeatedly made using a temperature probe. A decoder and controller respond to an analog voltage or temperature signal from the temperature probe to read an appropriate correction factor from the memory and apply a control voltage to a local oscillator. After the control voltage is applied, the controller measures the frequency error between the local oscillator and a transmitted signal received by the radio. If the error is within acceptable limits, the temperature is read again and the process repeated. If the error is not within acceptable limits, correction is achieved by detecting fire extent of frequency drift and generating a control voltage until the frequency drift has been compensated out. The new data indicating the appropriate control voltage for that temperature is stored in the memory.

The need to continuously measure temperature limits the effectiveness of this conventional method. Temperature measurements by a temperature probe are subject to error. Further error is introduced when the analog voltage corresponding to the temperature is quantized as a digital number. The calculation for determining the control voltage for the particular temperature introduces additional error. Even small errors can produce substantial error in the determined output frequency of the reference oscillator. For example, a frequency error of +1.5 ppm corresponds to +1.35 KHz at 900 MHz carrier frequency. This is a substantial error for radios used in a communication system according to the Advanced Mobile Phone Service (AMPS) standard, where channel bandwidth is 30 KHz or for radios according to the Narrowband Advanced Mobile Phone Service (NAMPS) standard, where channel bandwidth is only 10 KHz.

Accordingly, there is a need in the art for an improved method and apparatus for temperature compensation of a reference oscillator in a communication device.

BRIEF DESCRIPTION OF THE DRAWINGS

The features of the present invention, which are believed to be novel, are set forth with particularity in the appended claims. The invention, together with further objects and advantages thereof, may best be understood by making reference to the following description, taken in conjunction with the accompanying drawings, in the several figures of which like reference numerals identify identical elements, and wherein:

DETAILED DESCRIPTION OF A PREFERRED EMBODIMENT

Figure 1:
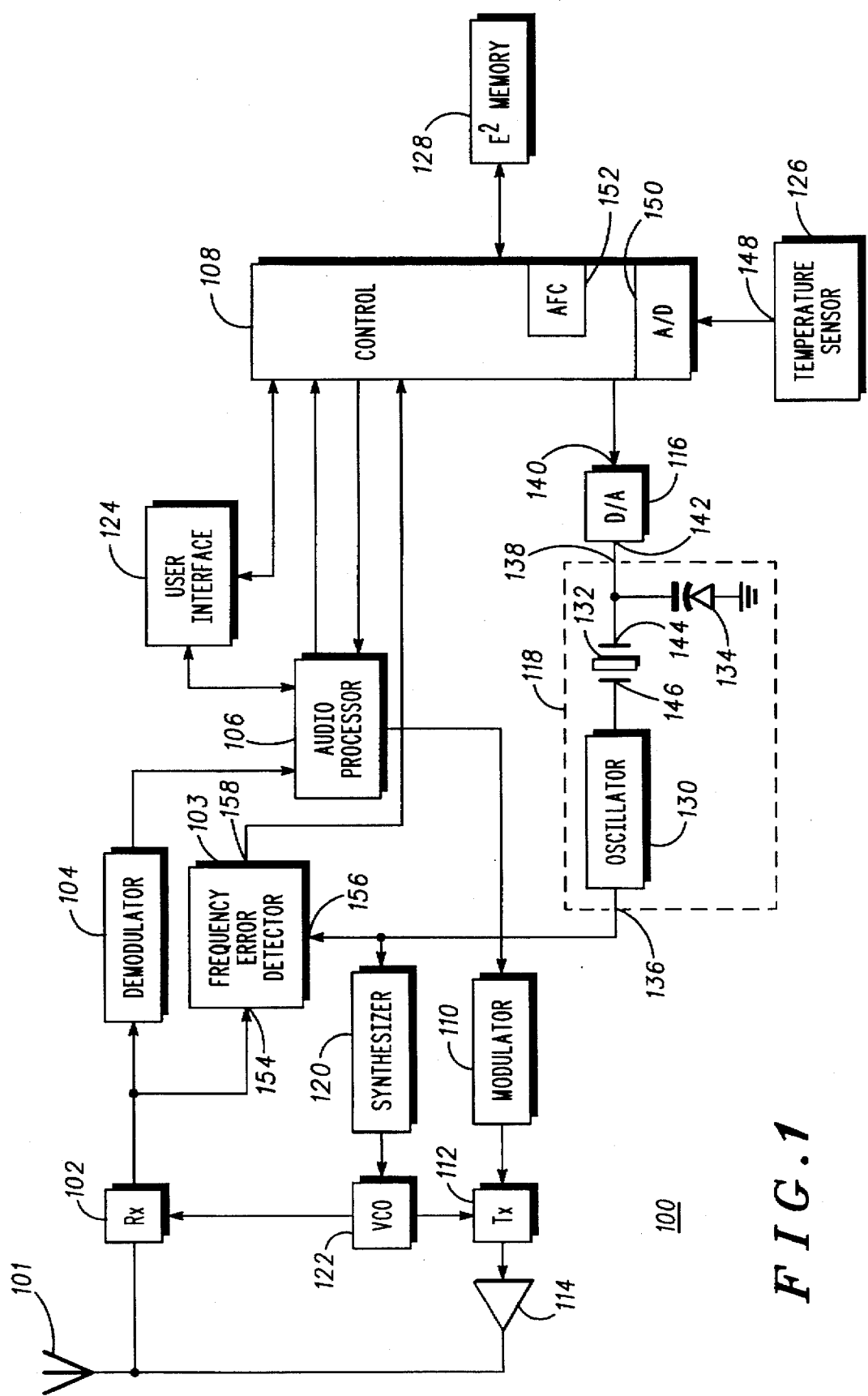
FIG. 1 is a block diagram of a communication device according to the present invention.

Referring now to FIG. 1, a communication device 100 includes an antenna 101, a receiver 102, a frequency error detector 103, a demodulator 104, an audio processor 106, and a controller 108. The communication device 100 further includes a modulator 110, a transmitter 112 and a power amplifier 114. The communication device 100 still further includes a digital to analog converter or DAC 116, a reference oscillator 118, a frequency synthesizer 120 and a voltage controlled oscillator or VCO 122. For controlling operation of the communication device 100 by a user, the communication device 100 also includes a user interface 124. For sensing temperature, the communication device 100 further includes a temperature sensor and for storing data, the communication device 100 further includes a memory 128. The communication device 100 may be a radiotelephone, such as a cellular or cordless telephone handset, or the communication device 100 may be a mobile radio.

For reception of voice or data by the communication device 100, the antenna 101 is configured to receive electromagnetic energy transmitted by a remote transceiver and produce electrical signals at radio frequencies. The receiver 102 is coupled to the antenna 101 and is configured for receiving a radio frequency (RF) signal. Typically, the RF signal is transmitted by a remote transceiver according to a predefined communications protocol. Examples of such protocols include the Advanced Mobile Phone Service (AMPS) or Narrowband Advanced Mobile Phone Service (NAMPS). In such protocols, communication channels are predefined at specified frequencies for transmission and reception of RF signals between the communication device 100 and the remote transceiver. The RF signals are suitably modulated to carry voice or data information. The demodulator 104 receives the modulated RF signals from the receiver 102 and demodulates them to extract the voice or data. The demodulator 104 provides the voice or data to the audio processor 106 for conversion to audio signals. An indication of the audio signals is provided to the controller 108 and to the user interface 124. The user interface 124 typically includes a speaker, a microphone, a keypad and a display.

For transmission of voice or data from the communication device 100, the controller 108 and the user interface provide an indication of audio signals to the audio processor 106. The audio processor 106 conveys the voice or data to the modulator 110, which provides audio signals to the transmitter 112. The transmitter 112 modulates an RF carrier signal according to the audio signals received from the modulator 110 to produce RF signals. The power amplifier 114 amplifies the RF signals and provides them to the antenna for transmission to the remote transceiver.

For providing channel selectivity in the receiver 102 and the transmitter 112, the VCO 122 provides a well-regulated oscillating signal to the receiver 102 and transmitter 112 under control of the synthesizer 120. The synthesizer 120 provides an oscillating signal to the VCO 122 at a frequency of reception or transmission, or at a multiple thereof. In response to control signals received from the controller 108, the synthesizer varies the frequency of reception or transmission to tune the receiver 102 or transmitter 112, respectively, to a particular channel or frequency. Some control lines and other connections are omitted from the block diagram of FIG. 1 so as to not unduly complicate the drawing figure. The oscillating signals provided to the VCO 122 by the synthesizer 120 are produced in response to an oscillating signal provided by the reference oscillator 118.

The reference oscillator 118 includes an oscillator circuit 130, a crystal 132 and a varactor 134. The reference oscillator 118 has an output 136 for providing the oscillating signal and an input 138 for receiving a control voltage. The reference oscillator 118 is configured to provide an oscillating signal at the output 136 at an output frequency. The output frequency varies with temperature according to a predetermined relationship. The output frequency is variable in response to the control voltage. The control voltage is an analog voltage. To permit the controller 108 to vary the control voltage, the DAC 116 has an input 140 for receiving a digital control signal from the controller 108. In response to the digital control signal, the DAC 116 produces an analog voltage at an output 142 corresponding to the digital control signal. Preferably, the DAC 116 is an 8 bit digital to analog converter, but other configurations may be used as well.

The crystal 132 has a terminal 144 and a terminal 146. The crystal 132 provides a frequency stable impedance for the reference oscillator 118. The frequency characteristic of the crystal 132 has a frequency variation with temperature defined according to the following relationship:

$$\Delta F = A(T-T_i) + C(T-T_i)^3 \quad (1)$$

where $\Delta F$ is the variation in frequency in parts per million (ppm), A and C are coefficients and $T_i$ is the inflection temperature. According to the present invention, the crystal 132 has printed directly on the package a crystal code defining the relationship between the crystal frequency and temperature. Specifically, the crystal code includes letters or numbers defining A, C and $T_i$.

The oscillator circuit 130 is a conventional circuit which receives the oscillating signal from the crystal 132 and conveys it to the synthesizer 120. The oscillator circuit 130 may provide buffering, impedance matching, level shifting and other functions to ensure accurate receipt of the oscillating signal at the synthesizer 120.

The temperature sensor 126 has an output 148. The temperature sensor 126 provides at the output 148 an analog signal proportional to measured temperature. Alternatively, the temperature sensor 126 may be formed using a thermistor or a diode. Preferably, the temperature sensor 126 is located in the communication device 100 as close to the reference oscillator 118 as possible to ensure that the temperature sensor 126 measures the temperature of the reference oscillator 118, generally, and the crystal 132 in particular. Such a placement minimizes subsequent errors due to temperature gradients in the communication device 100. Similarly, the varactor 134, which may also have a temperature dependence, should be placed near the crystal 132 and the temperature sensor 126.

The memory 128 is preferably a non-volatile read-write memory such as an electrically erasable programmable read only memory, or $E^2PROM$. The memory is addressable by the controller 108 for storing and reading data. Non-volatility is an important attribute of memory 128 so that data stored in the memory 128 during manufacture and test of the communication device 100 is retained in the memory 128 for use during subsequent operation of the communication device.

The frequency error detector 103 has a first input 154 coupled to the receiver, a second input 156 coupled to the oscillator 130 and an output 158 coupled to the controller 108. At the first input 154, the frequency error detector 103 receives a reference signal from the receiver. The reference signal is the RF signal transmitted by the remote transceiver and received by the receiver 102. The frequency at which this reference signal is received is presumed to be accurate for the channel on which the communication device 100 is communicating. As will be described below, the frequency of the reference signal is used for providing automatic frequency control by the communication device 100. At the second input 156, the frequency error detector 103 receives the output signal of the reference oscillator 118.

The frequency error detector 103 produces an indication of frequency error between the output frequency of the reference oscillator 118 and a received frequency, the frequency of the reference signal. According to the present invention, the output of the frequency error detector 103 is in the form of a frequency correction step size and a frequency correction step direction. The frequency correction step size is preferably a binary value indicating an amount to increase or decrease the output frequency of the reference oscillator to reduce the indication of frequency error, and the frequency correction step direction indicates whether to increase or decrease the output frequency. The frequency error detector 103 is thus coupled to the receiver 102 for determining an indication of frequency error between the reference frequency and the output frequency of the reference oscillator 118.

The controller 108 is preferably a microcontroller. The controller 108 operates in response to a predetermined program of instructions and data stored in memory such as memory 128. Among these instructions are a group of instructions forming an automatic frequency control, or AFC routine 152. The controller 108 may itself include memory for storing instructions or data, or additional storage devices such as random access memory (RAM) or read only memory (ROM) may be coupled to the controller 108.

The controller 108 includes an analog to digital converter or ADC 150 coupled to the temperature sensor 126. The ADC 150 receives the analog signal produced by the temperature sensor 126 and produces a digital value which is used by the controller 108 as an indication of temperature. The ADC 150 is preferably either an 8 bit or 10 bit analog to digital converter. Alternatively, the ADC 150 may be a separate discrete element of the communication device 100. However, it is preferred to use a controller such as controller 108 which incorporates an ADC such as ADC 150 in the controller, since design goals for the communication device include minimizing parts count and physical size of the communication device 100 in order to minimize manufacturing cost.

According to the present invention, at the time of manufacture, the crystal code is read automatically from the crystal 132 using machine vision incorporated in the manufacturing equipment. These values are conveyed from the manufacturing equipment to the controller 108, processed by the controller 108 and stored in the memory 128 as data representative of a relationship between an indication of temperature and a corresponding output frequency of the reference oscillator 118 and the crystal 132. Subsequently, during operation of the communication device 100 at the time the communication device 100 is powered up, the controller 108 determines an indication of temperature of the reference oscillator or crystal 132. In response to the indication of temperature, the output frequency of the reference oscillator is corrected to a nominal value for that temperature. The output frequency is warped according to the following equation:

$$warp = B + A(T_{A/D} - T_i) + C(T_{A/D} - T_i)^3 \quad (2)$$

where A, B and C are coefficients read from the memory 128 and $T_{A/D}$ is the indication of temperature provided to the controller 108 by the temperature sensor 126 and the ADC 150. The controller 108 warps or corrects the output frequency of the reference oscillator 118 by providing a control signal to the DAC 116 in response to the indication of temperature and the data from the memory 128. In response, the DAC 116 provides a control voltage to the reference oscillator to adjust the output frequency of the reference oscillator 118. After power up of the communication device 100, during continued operation of the communication device 100, no temperature measurements are made for the purpose of correcting frequency error.

After the initial correction or temperature compensation of reference oscillator output frequency using the stored data, correction of frequency error is provided by automatic frequency control under direction of the AFC routine 152. The frequency error detector 103 determines an indication of frequency error between the output frequency of the reference oscillator and the received frequency of the reference signal, received from the remote transceiver. The frequency error may be due to variation in the temperature of the communication device 100, particularly variation in the temperature of the crystal 132, or may be due to aging of the crystal 132. In response to the frequency step correction size and frequency step correction direction, the controller 108 provides a control signal to the DAC 116 which, in response, provides a control voltage to the reference oscillator 118. As a result, the output frequency of the reference oscillator 118 is varied according to the step size and step direction. The process of frequency error detection, step size and step direction determination, and correction is repeated until the indication of frequency error is less than a predetermined maximum. Thus, subsequent to the first correction of the output frequency, the controller 108 provides the control voltage to the reference oscillator 118 only in response to the indication of frequency error.

Because the automatic frequency control function is implemented using only discrete frequency steps in a specified frequency step size and step direction, limits are needed to ensure that the frequency step is an accurate choice and not likely to move the communication device further out of frequency lock with the received signal. According to the present invention, one or more limit values are calculated at the time of manufacture in response to the data stored in the memory 128 and the indication of temperature provided by the temperature sensor. Typical relations for initially determining limit offset values are indicated below:

$$\text{limit} = \frac{0.82}{K_S - 2}$$

$$K_S = \frac{F_2 - F_1}{W_2 - W_1} - \text{KHz/step}$$

Here, $W_1$ and $W_2$ are digital to analog converter step values and $F_2$ and $F_1$ are frequency values. Other limit calculations may be suitable as well.

The limit offset value is preferably the same for each warp value independent of temperature. However, as temperature changes, the warp value changes as defined by equation (2) above. Therefore, the limit value is periodically corrected according to the new temperature. That is, after waiting a predetermined time limit, the communication device according to the present invention determines an indication of temperature of the reference oscillator and, in response to the indication of temperature, updates the limit value. The limit value is updated by determining the theoretical warp value, then adding to the warp value the limit offset determined initially.

Figure 2:
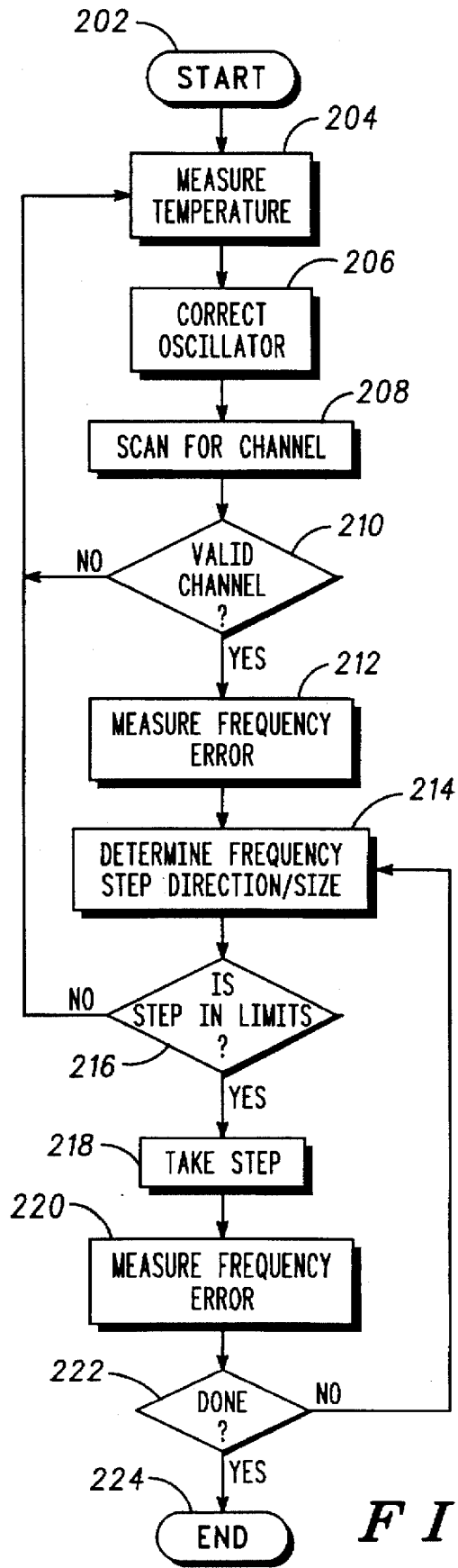
FIG. 2 is a flow diagram illustrating a method of operating the communication device of FIG. 1 according to the present invention.

Referring now to FIG. 2, it shows a flow diagram illustrating operation of the communication device 100 of FIG. 1 according to the present invention. The method begins at step 202, after the data characteristic of the predetermined relationship between the output frequency of the reference oscillator and temperature are stored in the memory 128. At step 202, the communication device is powered on. At step 204, the method includes determining an indication of temperature of the reference oscillator 118. That is, the temperature sensor 126 provides an analog signal indicative of the temperature, which signal is converted to digital data by the ADC 150.

At step 206, in response to the indication of temperature, the method continues by correcting the output frequency of the reference oscillator 118. The controller 108 reads data from the memory 128 defining the coefficients A, B and C corresponding to the indication of temperature and calculates a warp value according to equation (2) above. The controller 108 provides a control signal to the DAC 116 to warp the reference oscillator 118, the control signal being converted to a control voltage by the DAC 116.

The method continues at step 208 where the communication device 100 scans for a valid channel. The controller 108 controls the synthesizer 120 to tune the receiver 102 to frequencies corresponding to channels defined by the communications protocol, such as AMPS. If a valid channel is not located, in step 210, control is returned to step 204 to repeat the temperature measurement. If a valid channel is located, control proceeds to step 212.

At step 212, the frequency error is measured. The frequency error detector 103 compares the output frequency of the reference oscillator 118 and the received frequency, the frequency of the reference signal. The frequency error detector 103 determines a frequency correction in the form of a frequency correction step size and a frequency correction step direction, which are provided to the controller 108. For example, the frequency correction step direction may indicate changing the output frequency of the reference oscillator by a factor of two, and the frequency correction step direction may indicate increasing, rather than decreasing, the frequency. Alternatively, the frequency correction step size may be predefined as a default value which is selected by the controller 108.

At step 216, the controller 108 determines if the frequency correction step size is less than a limit value. When the frequency correction is less than the limit value, in step 218 the method continues by taking the frequency step, correcting the output frequency of the reference oscillator 118 according to the frequency correction. Frequency error is again measured in step 220 and compared to a predetermined maximum error. At step 222, if the frequency error is not less than the predetermined maximum, control returns to step 214 for additional frequency correction. If, at step 222, the indication of frequency error is less than the predetermined maximum, the method ends at step 224. Alternatively, the method could end when the frequency correction step direction changes sign or its binary value, indicating that the difference between the output frequency of the reference oscillator 118 and the received frequency has changed sign. This corresponds to a zero crossing of the error.

If, at step 216, the frequency correction step size was not less than the limit value, control returns to step 204 to again measure temperature. It should be noted that this is a condition unlikely to happen and is indicative of component failure.

To improve the accuracy of the automatic frequency control operation, steps 214, 216, 218, 220 and 222 could be repeated using successively smaller step sizes. For example, in an initial "fast lock" or coarse locking operation, the frequency step size could be relatively large and the reference oscillator output frequency stepped until the frequency correction step direction changes sign. Thus, such a method according to the present invention includes the step of adjusting the output frequency by a coarse step size until the difference or error satisfies a first condition. At that point, the step size could be reduced, for example, to one-half or one-third the fast lock step size for performance of a "slow lock" operation. When the frequency correction step direction again changes sign, the step size could be reduced a final time, again by a factor of one-half or one-third, for example. With this small step size, the automatic frequency control routine performs a "tracking" operation, keeping the reference oscillator output frequency closely locked to the received frequency. Thus, the method according to the present invention would include the further step of adjusting the output frequency by a fine step size until the difference or error satisfies a second condition. The first condition and the second condition correspond to the change in sign or direction of the frequency error correction. However, other conditions, such as obtaining a frequency error less than a predetermined amount, could be implemented as well.

Figure 3:
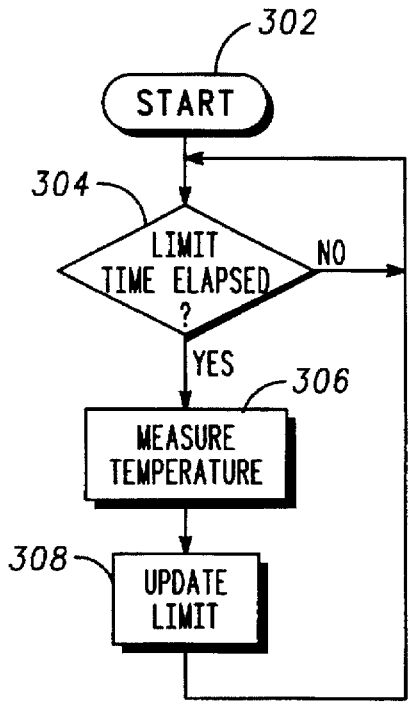
FIG. 3 is a flow diagram further illustrating a method of operating the communication device of FIG. 1 according to the present invention.

FIG. 3 is a flow diagram illustrating a method according to the present invention for updating the limit value of the frequency step size. This routine is preferably performed periodically, for example, four times a minute while the communication device is in operation. The method begins at step 302. At step 304, it is determined if a predetermined time, such as 15 seconds (referred to in FIG. 3 as the limit time), has elapsed. If so, control continues at step 306. If the limit time has not elapsed, control returns to step 304. At step 306, temperature is measured, producing an indication of temperature of the reference oscillator 118. At step 308, the limit value or limit values are updated by determining the warp value corresponding to the current temperature and adding the limit offset to the warp value. Control then returns to step 304 to wait for elapse of the predetermined limit time.

As can be seen from the foregoing, the present invention provides a method and apparatus for controlling a reference oscillator in a communication device by temperature compensating the reference oscillator. At the time of manufacture, characterizing data are stored in non-volatile memory in the communication device. When the communication device is powered up or returned from out of service, the characterizing data are read and used to provide an initial correction to the output frequency of the reference oscillator. Subsequently, an automatic frequency control operation is performed using the RF signal received from a remote transmitter as a reference signal. A frequency correction is determined in the form of a frequency step size and step direction. The output frequency of the reference oscillator is repeatedly stepped until frequency error is minimized.

While a particular embodiment of the present invention has been shown and described, modifications may be made. For example, if the transmit path including the modulator 110, the transmitter 112 and the power amplifier 114 is deleted, the communication device 100 may form a paging receiver with all the benefits and advantages of the present invention. It is therefore intended in the appended claims to cover all such changes and modifications which fall within the true spirit and scope of the invention.

What is claimed is:

1. A method for controlling a reference oscillator in a communication device, the method comprising the steps of:
   (a) determining an indication of temperature of the reference oscillator;
   (b) in response to the indication of temperature, correcting an output frequency of the reference oscillator;
   (c) selecting a valid channel for communication;
   (d) determining an indication of frequency error between the output frequency of the reference oscillator and a received frequency;
   (e) in response to the indication of frequency error, determining a frequency correction;
   (f) when the frequency correction is less than a limit value, correcting the output frequency of the reference oscillator according to the frequency correction; and
   (g) repeating steps (d)–(f) until the indication of frequency error is less than a predetermined maximum.

2. A method for controlling a reference oscillator as recited in claim 1 wherein the method further comprises the step of, initially, storing data representative of a relationship between the indication of temperature and a corresponding output frequency of the reference oscillator, and wherein step (b) comprises the step of setting the output frequency in response to the indication of temperature of the reference oscillator and the data.

3. A method for controlling a reference oscillator as recited in claim 2 wherein the steps of (d) determining the indication of frequency error and (f) correcting the output frequency of the reference oscillator exclude determining an indication of temperature.

4. A method for controlling a reference oscillator in a communication device, the method comprising the steps of:
   (a) determining an indication of temperature of the reference oscillator;
   (b) in response to the indication of temperature, correcting an output frequency of the reference oscillator;
   (c) selecting a valid channel for communication;
   (d) determining an indication of frequency error between the output frequency of the reference oscillator and a received frequency;
   (e) in response to the indication of frequency error, determining a frequency correction;
   (f) when the frequency correction is less than a limit value, correcting the output frequency of the reference oscillator according to the frequency correction;
   (g) repeating steps (d)–(f) until the indication of frequency error is less than a predetermined maximum; and
   (h) periodically correcting the limit value.

5. A method for controlling a reference oscillator as recited in claim 4 wherein the step of periodically correcting the limit value comprises the steps of:
   (h) waiting a predetermined limit time;
   (I) determining an indication of temperature of the reference oscillator; and
   (j) in response to the indication of temperature of the reference oscillator, updating the limit value.

6. A method for controlling a reference oscillator in a communication device, the method comprising the steps of:
   (a) determining an indication of temperature of the reference oscillator;
   (b) in response to the indication of temperature, correcting an output frequency of the reference oscillator;
   (c) selecting a valid channel for communication;
   (d) determining an indication of frequency error between the output frequency of the reference oscillator and a received frequency;
   (e) in response to the indication of frequency error, determining a frequency correction including determining a frequency correction step size and a frequency correction step direction;
   (f) when the frequency correction is less than a limit value, correcting the output frequency of the reference oscillator according to the frequency correction; and
   (g) repeating steps (d)–(f) until the indication of frequency error is less than a predetermined maximum.

7. A method for controlling a reference oscillator in a communication device, the reference oscillator including a crystal having a crystal code defining a relationship between a crystal frequency and temperature the method comprising the steps of:
   (a) determining the crystal code;
   (b) determining an initial temperature;
   (c) calculating a limit value in response to the crystal code and the initial temperature;
   (d) determining an indication of temperature of the reference oscillator;
   (e) in response to the indication of temperature, correcting an output frequency of the reference oscillator;
   (f) selecting a valid channel for communication;
   (g) determining an indication of frequency error between the output frequency of the reference oscillator and a received frequency:
   (h) in response to the indication of frequency error, determining a frequency correction;
   (i) when the frequency correction is less than the limit value, correcting the output frequency of the reference oscillator according to the frequency correction; and
   (j) repeating steps (g)–(i) until the indication of frequency error is less than a predetermined maximum.

8. A communication device comprising:
   a receiver configured for receiving a radio frequency (RF) signal at a reference frequency;
   a reference oscillator configured to provide an oscillating signal at an output frequency, the output frequency varying with temperature according to a predetermined relationship, the output frequency being variable in response to a control voltage;
   a memory for storing data, the data being characteristic of the predetermined relationship;
   a frequency error detector coupled to the receiver for determining an indication of frequency error between the reference frequency and the output frequency;
   a temperature sensor for providing an indication of temperature; and
   a controller coupled to the receiver, the memory, the frequency error detector, the temperature sensor and the reference oscillator for receiving the indication of temperature, the indication of frequency error and the data, the controller first correcting the output frequency by providing the control voltage to the reference oscillator in response to the indication of temperature and the data, the control voltage corresponding to a frequency correction step size and a frequency correction step direction, the controller determining a limit value in response to the indication of temperature and the data, the controller providing the control voltage only when the frequency correction step size is less than the limit value, the controller subsequently providing the control voltage to the reference oscillator only in response to the indication of frequency error.

9. A communication device as recited in claim 5 wherein the controller repeatedly increments the control voltage according to the frequency correction step size and the frequency correction step direction until the indication of frequency error is less than a predetermined maximum.

10. A communication device as recited in claim 9 wherein the controller periodically receives the indication of temperature and updates the limit value in response to the indication of temperature and the data.

11. A method of operating a communication device, the communication device including a reference oscillator, the method comprising the steps of:
   (a) initially storing data representative of a relationship between an indication of temperature and an output frequency of the reference oscillator;
   (b) subsequently, during operation of the communication device, reading a current indication of temperature to set an initial frequency of the reference oscillator;
   (c) as operation of the communication device continues, determining a difference between the initial frequency and a reference frequency;
   (d) repeatedly correcting the output frequency to minimize the difference by adjusting the output frequency by a frequency correction step size; and (e) periodically determining an indication of temperature, updating a limit value according to the indication of temperature and comparing the frequency correction step size with the limit value.

12. A method of operating a communication device as recited in claim 11 wherein step (d) comprises the steps of:

(d1) adjusting the output frequency by a coarse step size until the error satisfies a first condition; and (d2) adjusting the output frequency by a fine step size until the difference satisfies a second condition.

* * * * *